United States Patent
Wang

(10) Patent No.: US 10,446,586 B2
(45) Date of Patent: Oct. 15, 2019

(54) PIXEL UNIT, ARRAY SUBSTRATE AND MANUFACTURING METHOD THEREFOR, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Xiao Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/135,689

(22) Filed: Apr. 22, 2016

(65) Prior Publication Data

US 2016/0322398 A1    Nov. 3, 2016

(30) Foreign Application Priority Data

Apr. 29, 2015 (CN) .......................... 2015 1 0214372

(51) Int. Cl.
*H01L 27/12* (2006.01)
*H01L 29/41* (2006.01)
*H01L 29/417* (2006.01)

(52) U.S. Cl.
CPC .... *H01L 27/1244* (2013.01); *H01L 29/41733* (2013.01)

(58) Field of Classification Search
CPC .................................................... H01L 27/1244
USPC ............................................................ 257/72
See application file for complete search history.

(56) References Cited

U.S. PATENT DOCUMENTS

| 2002/0113916 | A1 | 8/2002 | Hashiguchi et al. |
| 2006/0024895 | A1* | 2/2006 | Kim ..................... H01L 27/1214 438/299 |
| 2006/0076562 | A1* | 4/2006 | Lee ......................... H01L 29/12 257/72 |
| 2006/0180569 | A1 | 8/2006 | Hsi-Ming |

(Continued)

FOREIGN PATENT DOCUMENTS

| CN | 1728363 A | 2/2006 |
| CN | 102496625 A | 6/2012 |

(Continued)

OTHER PUBLICATIONS

First Office Action regarding Chinese Application No. 201510214372.9, dated May 8, 2017. Translation provided by Dragon Intellectual Property Law Firm.

(Continued)

*Primary Examiner* — Moazzam Hossain
*Assistant Examiner* — Omar F Mojaddedi
(74) *Attorney, Agent, or Firm* — Harness, Dickey & Pierce, P.L.C.

(57) ABSTRACT

Disclosed are a pixel unit, an array substrate and a manufacturing method therefor, a display panel and a display device. At least two step portions adjacent to each other in an upward direction are provided at at least one of a first side of a drain electrode close to a display region and a second side of the drain electrode away from the display region, such that a pixel electrode is lapped onto the drain electrode gently.

16 Claims, 4 Drawing Sheets

(56) References Cited

U.S. PATENT DOCUMENTS

| | | | |
|---|---|---|---|
| 2011/0013106 A1* | 1/2011 | Liu | G02F 1/136286 349/46 |
| 2012/0241738 A1* | 9/2012 | Imoto | H01L 29/7869 257/43 |
| 2013/0043464 A1 | 2/2013 | Lu et al. | |
| 2015/0372024 A1 | 12/2015 | Wang | |
| 2016/0284741 A1 | 9/2016 | Wang et al. | |

FOREIGN PATENT DOCUMENTS

| | | | |
|---|---|---|---|
| CN | 104091807 A | 10/2014 | |
| CN | 104409413 A | 3/2015 | |

OTHER PUBLICATIONS

Third Office Action regarding Chinese Application No. 201510214372.9, dated Jan. 16, 2018. Translation provided by Dragon Intellectual Property Law Firm.

Second Chinese Office Action regarding Application No. 201510214372.9 dated Oct. 10, 2017. English translation provided by http://globaldossier.uspto.gov.

Fourth Chinese Office Action regarding Application No. 201510214372.9 dated Mar. 15, 2018. Translation provided by Dragon Intellectual Property Law Firm.

* cited by examiner

PIXEL UNIT, ARRAY SUBSTRATE AND MANUFACTURING METHOD THEREFOR, DISPLAY PANEL AND DISPLAY DEVICE

CROSS-REFERENCE TO RELATED APPLICATION

The present application claims a priority to Chinese patent application No. 201510214372.9 filed on Apr. 29, 2015, which is incorporated herein by reference in its entirety.

TECHNICAL FIELD

The present disclosure relates to the field of display technology, and in particular, to a pixel unit, an array substrate and a manufacturing method therefor, a display panel and a display device.

BACKGROUND

In the conventional field of liquid crystal display technology, the thin film transistors (TFTs), which are for switching on or off pixels, play important role in a high-definition display device.

In a pixel unit of a array substrate in related technologies, a pixel electrode lapped onto a drain electrode having a large thickness is prone to be fractured at boundary positions of the drain electrode, which results in circuit break between the drain electrode and the pixel electrode and failure in supplying power to the pixel electrode, thereby adversely affecting the display effect.

SUMMARY

A pixel unit, an array substrate and a manufacturing method therefor, a display panel and a display device are provided according to embodiments of the present disclosure, for solving a problem in related technologies that a pixel electrode lapped onto a drain electrode is prone to be fractured due to relative high steps at boundary positions of the drain electrode in a TFT component region.

In one aspect, it is provided a pixel unit in the present disclosure, the pixel unit includes a display region and a TFT component region. In the TFT component region, a base, a gate line, a gate insulating layer, an active layer, a data line, a source electrode, a drain electrode, and a pixel electrode lapped onto the drain electrode are provided sequentially from the bottom up. At least two step portions adjacent to each other in an upward direction are provided at at least one of a first side of the drain electrode close to the display region and a second side of the drain electrode away from the display region, and the pixel electrode is lapped onto the drain electrode gently.

Optionally, at least two step portions may be provided at each of the first side and the second side of the drain electrode.

Alternatively, at least two step portions may be provided at the first side or the second side of the drain electrode.

Optionally, two step portions may be provided at at least one of the first side and the second side of the drain electrode.

Optionally, a thickness of the drain electrode may be 4000 Å, and a height of a lower step of the two step portions provided at one side of the drain electrode may range from 1500 Å to 3500 Å.

Optionally, the two step portions provided at one side of the drain electrode may have an identical height.

Optionally, in a case that at least two step portions are provided at each of the first side and the second side of the drain electrode, the number of the step portions provided at the first side of the drain electrode is equal to the number of the step portions provided at the second side of the drain electrode.

Optionally, heights of the step portions provided at the first side of the drain electrode are respectively identical to heights of the step portions provided at the second side of the drain electrode.

In another aspect, it is provided an array substrate in the present disclosure, and the array substrate includes a pixel unit described above.

In another aspect, it is provided a display panel in the present disclosure, and the display panel includes the array substrate described above.

In another aspect, it is provided a display device in the present disclosure, and the display device includes the display panel described above.

In another aspect, it is provided a manufacturing method of an array substrate. The array substrate includes multiple pixel units, each of the multiple pixel units includes a display region and a TFT component region. The manufacturing method includes: providing a base, forming a patterned gate line on the base, forming a gate insulating layer on the gate line, and forming an active layer and a data line on the gate insulating layer; forming a patterned source electrode and a patterned drain electrode on the active layer; forming at least two step portions adjacent to each other in an upward direction at at least one of a first side of the drain electrode close to the display region and a second side of the drain electrode away from the display region by means of a partially transparent mask plate; and arranging a pixel electrode on the drain electrode having the step portions gently.

In the embodiments of the present disclosure, at least two step portions adjacent to each other in an upward direction are provided at at least one of a first side of the drain electrode close to the display region and a second side of the drain electrode away from the display region, such that the pixel electrode is lapped onto the drain electrode gently. Therefore, height of one step in the conventional technologies is shared by at least two step portions, such that a slope formed at a side of the drain electrode is relative gentle. Thus, the pixel electrode is lapped onto the drain electrode gently, a fracture of the pixel electrode at a boundary position corresponding to at least one of the first side and the second side of the drain electrode is prevented, and the yield of a device is increased.

BRIEF DESCRIPTION OF THE DRAWINGS

In order to illustrate the technical solutions of the embodiments of the present disclosure and related technologies more clearly, drawings to be used in the description of the related technologies and the embodiments of the present disclosure are described briefly hereinafter. Apparently, the drawings described hereinafter are only for some embodiments of the present disclosure, and other drawings may be obtained by those skilled in the art based on those disclosed drawings without creative labour.

DETAILED DESCRIPTION OF THE EMBODIMENTS

Figure 1A:
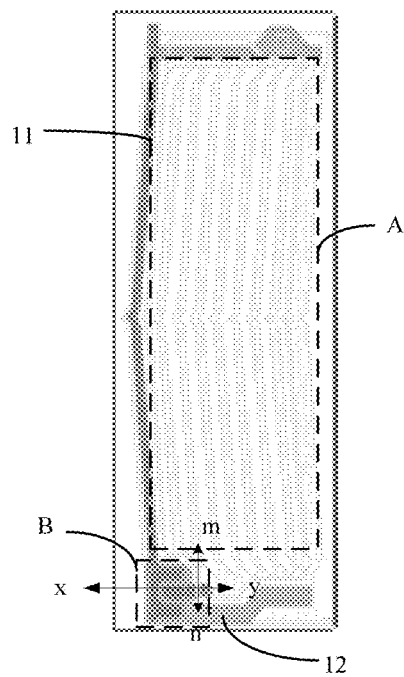
FIG. 1(a) is a plan view of one pixel unit in an array substrate.
Figure 1B:
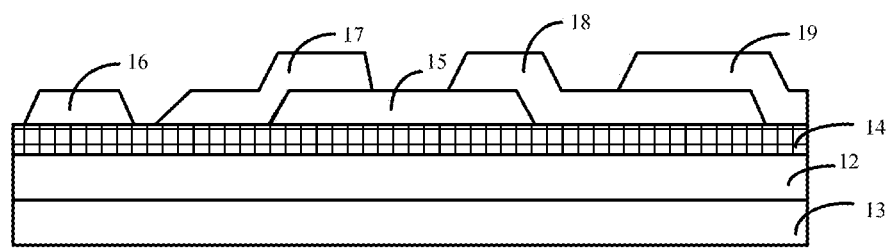
FIG. 1(b) is a sectional view of a TFT component region taken along a section line x-y shown in FIG. 1(a)

FIG. 1(a) illustrates a plan view of one pixel unit in a conventional array substrate of high aperture ratio advanced super dimension switch (HADS) mode. Pixel units are defined by intersections of data lines 11 and gate lines 12. Each pixel unit includes a display region A and a TFT component region B. As shown in FIG. 1(b) which illustrates a sectional view taken along a section line x-y shown in FIG. 1(a), in the TFT component region of the array substrate, a base 13, a patterned gate line 12 on the base, a gate insulating layer 14 on the gate line 12, a patterned semi-conductor layer 15 and a data line 16 on the gate insulating layer 14, and a source electrode 17 and a drain electrode 18 on the semi-conductor layer 15 are arranged sequentially from the bottom up. A pixel electrode 19 is further lapped onto a part of the drain electrode 18 and cooperates with a common electrode above the pixel electrode 19.

Figure 1C:
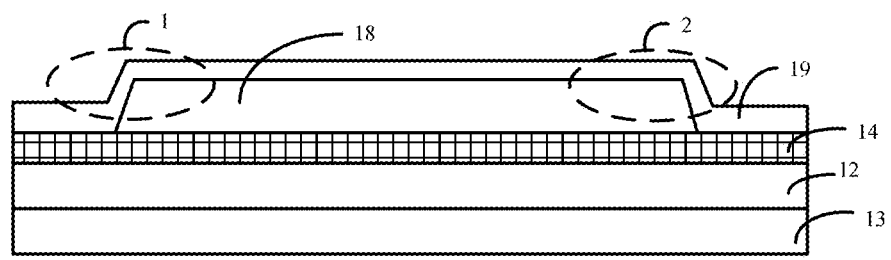
FIG. 1(c) is a sectional view of a TFT component region taken along a section line m-n shown in FIG. 1(a)

FIG. 1(c) illustrates a sectional view taken along a section line m-n shown in FIG. 1(a), and the section line m-n is parallel to an extending direction of each data line 11. As shown in FIG. 1(c), the drain electrode 18 has a relatively large thickness, steps formed at boundary positions 1 and 2 are relative high, while the pixel electrode 19 lapped onto the drain electrode 18 has a relative small thickness; thus, the pixel electrode 19 is prone to be fractured at the boundary positions 1 and 2, which results in circuit break between the drain electrode and the pixel electrode and failure in supplying power to the pixel electrode, thereby adversely affecting the display effect.

In order to make technical solutions and advantages of the present disclosure more apparent, the present disclosure is detailed hereinafter in conjunction with the drawings. Obviously, the described embodiments are merely a part of, rather than all of, the embodiments of the present disclosure. Any embodiment obtained by a person skilled in the art based on these disclosed embodiments without creative labour shall fall within the scope of the present disclosure.

In the embodiments of the present disclosure, at least two step portions which are adjacent to each other in an upward direction are provided at at least one of a first side of the drain electrode close to the display region and a second side of the drain electrode away from the display region, such that the pixel electrode can be lapped onto the drain electrode gently. Therefore, height of one step in the related technologies is shared by at least two step portions, such that a slope formed at at least one of the first side and second side of the drain electrode is relative gentle; thus, the pixel electrode is lapped onto the drain electrode gently, the pixel electrode is prevented from generating a fracture at a boundary position of the drain electrode, and the yield of a device is increased.

Solutions to which the present disclosure is related are described in detail below by means of following specific embodiments. The present disclosure includes but is not limited to the following specific embodiments.

Figure 2A:
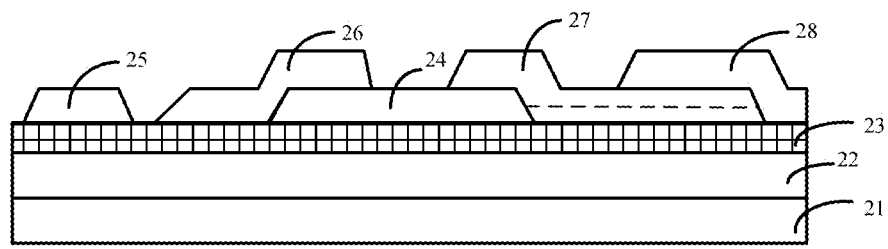
FIG. 2(a) is a schematic sectional view of a pixel unit according to an embodiment of the present disclosure.
Figure 2B:
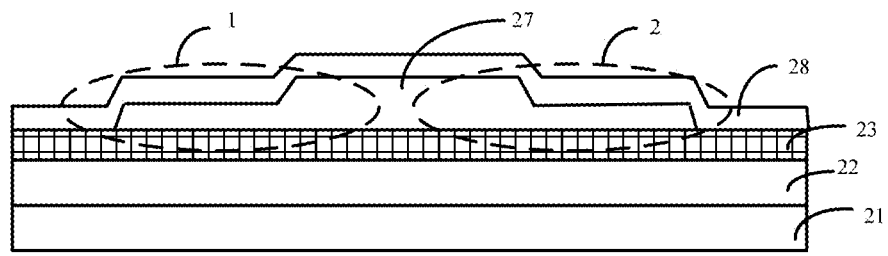
FIG. 2(b) is a schematic sectional view of a drain electrode of a pixel unit according to an embodiment of the present disclosure.

A pixel unit is provided according to some embodiments of the present disclosure, a plan view of the pixel unit may be understood with reference to a structure shown in FIG. 1(a). FIG. 2(a) illustrates a sectional view of a TFT component region of the pixel unit taken along a section line x-y perpendicular to an extending direction of each data line, and FIG. 2(b) illustrates a sectional view of the TFT component region of the pixel unit taken along a section line m-n parallel to the extending direction of each data line. Specifically, as shown in FIG. 2(a), the pixel unit mainly includes: a base 21, a patterned gate line 22 on the base 21, a gate insulating layer 23 which is located on the gate line 22 and covers a whole region where the base 21 locates, an active layer 24 and a data line 25 on the gate insulating layer 23, a source electrode 26 and a drain electrode 27 which are located on the active layer 24 and distributed on two sides of the active layer 24, and a pixel electrode 28 lapped onto the drain electrode 27. A position represented by a dotted line refers to a step surface between two step portions of the drain electrode. The step surface is represented by the dotted line since it is obscured by the drain electrode in FIG. 2(a). As shown in FIG. 2(b), with respect to a first side 1 of the drain electrode 27 close to a display region and a second side 2 of the drain electrode 27 away from the display region, at least two step portions adjacent to each other in an upward direction are arranged at at least one of the first side 1 and the second side 2, such that the pixel electrode 28 can be lapped onto the drain electrode 27 gently. The first side 1 and the second side 2 of the drain electrode 27 respectively correspond to two boundary positions of the drain electrode 27 in the extending direction of section line m-n.

Figure 3A:
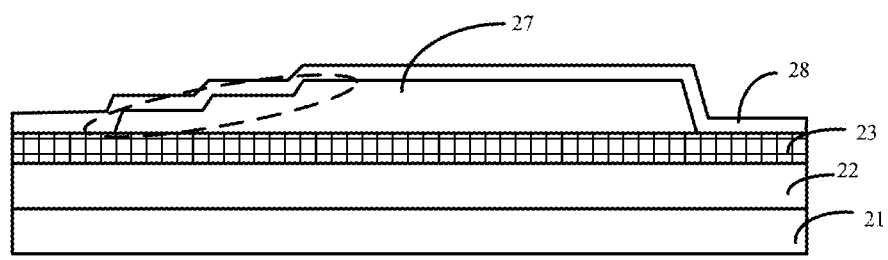
FIG. 3(a) is a schematic sectional view of a drain electrode according to an embodiment of the present disclosure, where at least two step portions are provided at one side of the drain electrode.

Optionally, as shown in FIG. 3(a), at least two step portions are provided at the first side 1 or the second side 2 of the drain electrode. Therefore, the first side 1 or the second side 2 of the drain electrode is ensured gentle with the arrangement of the step portions and the pixel electrode lapped onto the drain electrode is prevented from generating a fracture at one boundary position.

Figure 3B:
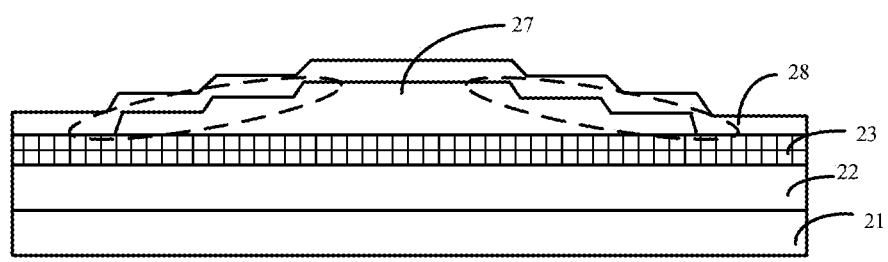
FIG. 3(b) is a schematic sectional view of a drain electrode according to an embodiment of the present disclosure, where at least two step portions are provided at each of two sides of the drain electrode.

Alternatively, as shown in FIG. 3(b), at least two step portions are provided at each of the first side 1 and the second side 2 of the drain electrode. Therefore, both sides of the drain electrode are ensured gentle with the arrangement of the step portions and the pixel electrode lapped onto the drain electrode is prevented from generating fractures at boundary positions. Even if the pixel electrode is fractured at one of the two boundary positions corresponding to the first side 1 and the second side 2, the drain electrode and the pixel electrode can still form an electric connection at the other boundary position.

It should be noted that, in FIG. 3(*a*) it is shown exemplarily that three step portions are provided at the first side 1 or the second side 2 of the drain electrode, however, in other embodiments, two step portions, four step portions or more step portions may be provided as long as that the number of the step portion is greater than or equal to two. Similarly, in FIG. 3(*b*) it is shown exemplarily that three step portions are provided at each of the first side 1 and the second side 2 of the drain electrode, however, in other embodiments, two step portions, four step portions or more step portions may be provided as long as the number of the step portion at each side is greater than or equal to two.

In a pixel unit according an embodiment of the present disclosure, two step portions are provided at at least one of the first side 1 and the second side 2 of the drain electrode. Considering that the drain electrode, as a wire, has a limited wiring width on an array substrate, the number of the step portions provided at two sides of the drain electrode cannot be too large. In the present disclosure, it is taken as an example that two step portions provided at one side, one of the two step portions is located at a lower layer and the other is located at an upper layer, and thus a slope formed at the side is adjusted to be relative gentle.

Figure 4:
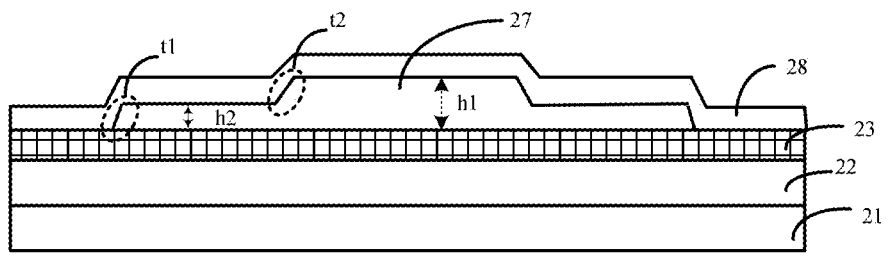
FIG. 4 is a schematic sectional view of a drain electrode according to an embodiment of the present disclosure, where two step portions are provided at one side of the drain electrode.

Further, in a case that two step portions are provided at one side, as shown in FIG. 4, a thickness h1 of the drain electrode 27 is fixed, generally about 4000 Å, and a height of a step portion t1 located at a lower layer of the two step portions ranges from 1500 Å to 3500 Å. Compared with providing only one step having a height identical to the thickness of the drain electrode in related technologies, by arranging two step portions t1 and t2 stage by stage at the side, the side has better gentleness. Therefore, during a procedure for forming a pixel electrode, the pixel electrode can be effectively lapped onto the drain electrode and is prevented from generating a fracture at a boundary position corresponding to the side.

In order to prevent fracture more effectively, optionally, each of the two step portions has a height of 2000 Å, that is, a height of a step portion at an upper layer is equal to that of a step portion at a lower layer. Therefore, height of one step in the related technologies is shared by two step portions, such that a slope formed at a side of the drain electrode is relative gentle.

In the embodiments described above, at least two step portions adjacent to each other in an upward direction are provided at at least one of the first side of the drain electrode close to the display region and the second side of the drain electrode away from the display region, such that the pixel electrode can be lapped onto the drain electrode gently. Therefore, height of one step in the related technologies is shared by at least two step portions, such that a slope formed at at least one of the first side and the second side of the drain electrode is relative gentle; thus, the pixel electrode is lapped onto the drain electrode gently, fracture of the pixel electrode at a boundary position of the drain electrode is prevented, and the yield of a device is increased.

Further, it is provided an array substrate according to some embodiments of the present disclosure, including a pixel unit described in the above embodiments.

Figure 5:
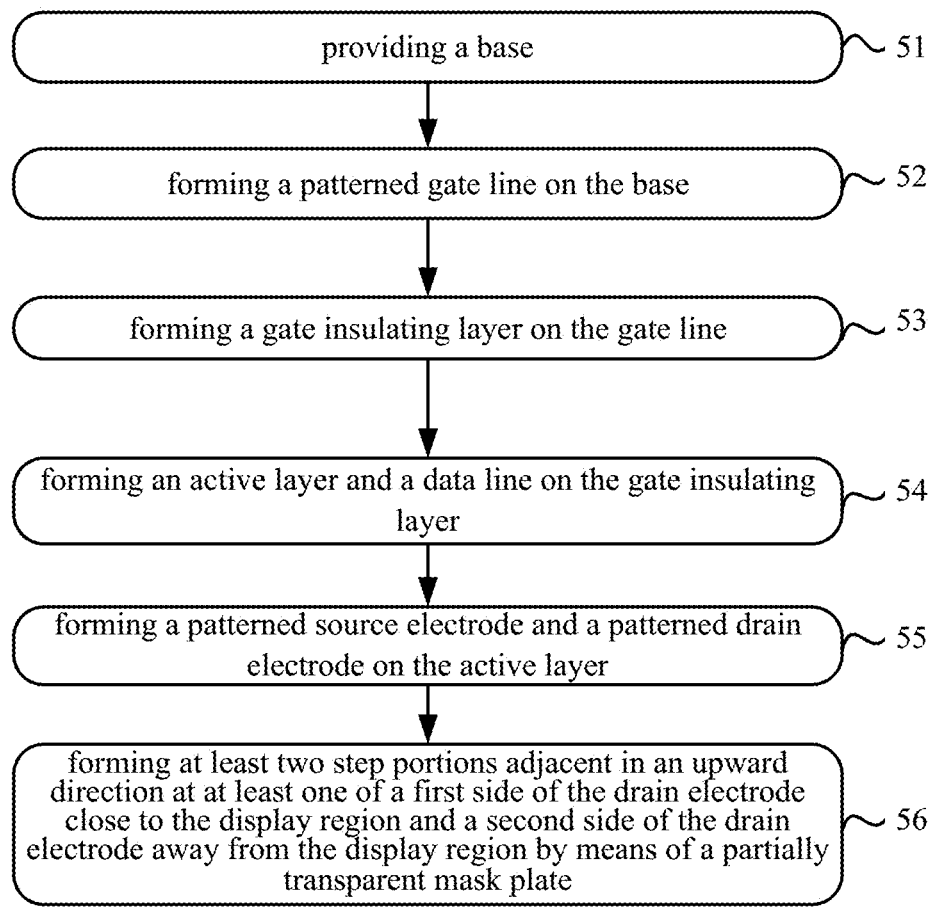
FIG. 5 is a flowchart of a manufacturing method of an array substrate according to an embodiment of the present disclosure.

Correspondingly, based on a same conception with the pixel unit described in the above embodiments, a manufacturing method of an array substrate is further provided according some embodiments of the present disclosure. As shown in FIG. 5, specifically, the method includes steps 51 to 57 as follows.

In step 51, a base is provided.

The base may be a glass base, a quartz base, a metal base or the like.

In step 52, a patterned gate line is formed on the base.

In the step 52, the gate line is manufactured in the same manner as the related technologies. A metal film layer is firstly deposited on the base in a chemical or physical deposition manner; and then the metal film layer is exposed, developed and etched by means of an ordinary mask plate to form the patterned gate line.

In step 53, a gate insulating layer is formed on the gate line.

An insulating film is arranged covering the gate line, thereby forming the gate insulating layer. Specifically, the gate insulating layer covers the whole region where the base locates.

In step 54, an active layer and a data line are formed on the gate insulating layer.

In step 55, a patterned source electrode and a patterned drain electrode are formed on the active layer.

The source electrode and the drain electrode formed in the step 55 are similar to those in the related technologies, and the source electrode and the drain electrode formed in the step 55 are distributed on two sides of the active layer.

In step 56, with respect to a first side of the drain electrode close to a display region and a second side of the drain electrode away from the display region, at least two step portions adjacent to each other in an upward direction are formed at at least one of the first side and the second side by means of a partially transparent mask plate.

Figure 6A:
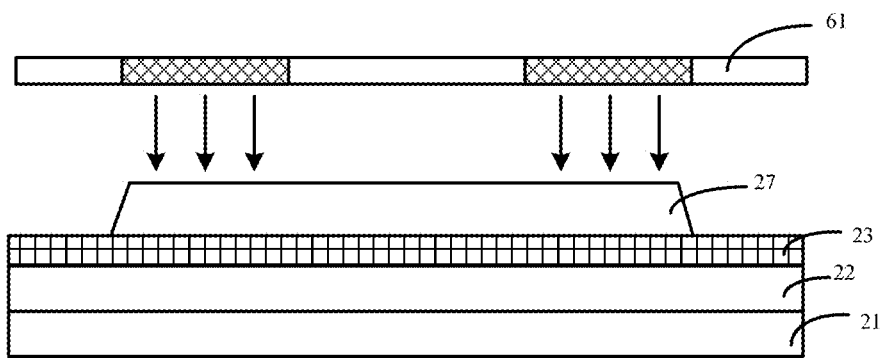
FIG. 6(a) is a sectional view of a drain electrode according to an embodiment of the present disclosure, which is manufactured after step 55 in FIG. 5 is finished.
Figure 6B:
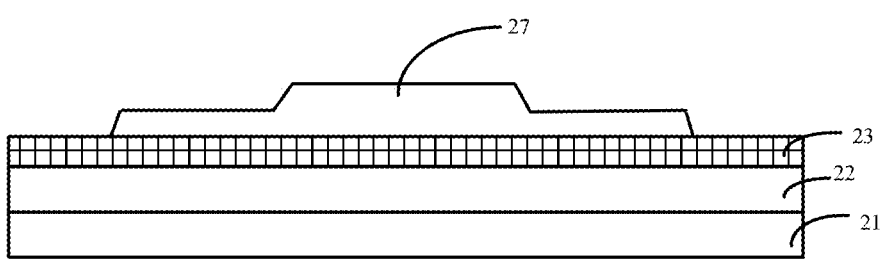
FIG. 6(b) is a schematic sectional view of a drain electrode according to an embodiment of the present disclosure, where a step portion is formed at each of two sides of the drain electrode.
Figure 6C:
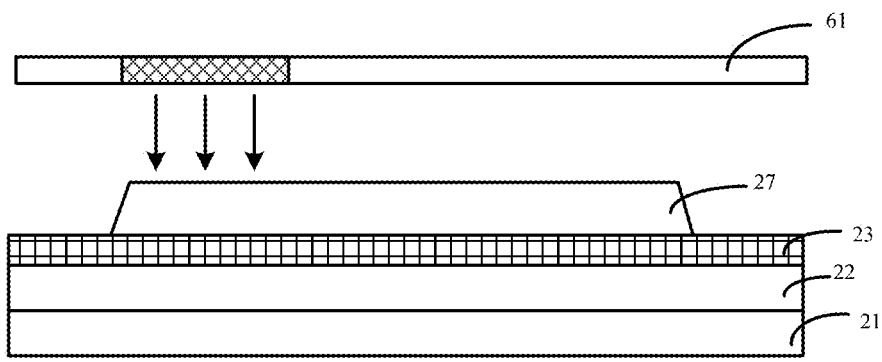
FIG. 6(c) is a schematic diagram of a mask plate for forming a step portion at one side of a drain electrode according to an embodiment of the present disclosure.

Reference is made to FIG. 6(*a*), which illustrates a sectional view of a drain electrode which is manufactured after the step 55 is finished according to some embodiments of the present disclosure. The drain electrode is exposed and developed by means of a partially transparent mask plate 61 to form step portions shown in FIG. 6(*b*). In the embodiments, a case that step portions are formed at each of the first side and the second side of the drain electrode is taken as an example. Alternatively, by means of a mask plate shown in FIG. 6(*c*), two step portions can be formed at the first side of the drain electrode close to a display region or at the second side of the drain electrode away from the display region.

In step 57, a pixel electrode is gently lapped onto the drain electrode having the step portions.

Since two step portions are formed at each of the first side and the second side of the drain electrode, slopes at both sides of the drain electrode have better gentleness. Thus, the pixel electrode can be lapped onto the drain electrode gently, fractures of the pixel electrode at boundary positions corresponding to two sides of the drain electrode can be prevented, and the yield of a device is increased.

It is further provided a display panel according to some embodiments of the present disclosure, including an array substrate described in the above embodiments.

Moreover, a display device is further provided according to some embodiments of the present disclosure, including the display panel described above. Specifically, the display device may be any product or component having a display function, such as, a liquid crystal display panel, a mobile phone, a tablet computer, a television, a display, a notebook computer, a digital picture frame, and a navigator.

Although the preferred embodiments of the present disclosure have been described, additional changes and modifications to those embodiments may be made by those skilled in the art once they learn of the basic inventive concepts. Therefore, it is intended that the appended claims shall be construed to include both the preferred embodiments and all such changes and modifications which fall within the scope of the present disclosure.

It is obvious for those skilled in the art to make various modifications to and variations of the present disclosure without departing from the spirit and scope of the present disclosure. Thus, provided that such modifications and variations of the present disclosure fall within the scope of the appended claims of the present disclosure and their equivalents, the present disclosure also intends to include those modifications and variations.

What is claimed is:

1. A pixel unit, comprising a display region and a thin film transistor (TFT) component region, wherein in the TFT component region, a base, a gate line, a gate insulating layer, an active layer and a data line, a source electrode and a drain electrode, and a pixel electrode lapped onto the drain electrode are provided sequentially from the bottom up,
    wherein an extension direction of a channel between the source electrode and the drain electrode is perpendicular to a direction oriented from the source electrode to the drain electrode;
    a top surface of the drain electrode has at least four step portions arranged along the extension direction of the channel, and portions of the top surface of the drain electrode at two sides of each of the at least four step portions have different heights relative to a top surface of the gate insulating layer;
    wherein the pixel electrode is in contact with each of the at least four step portions of the top surface of the drain electrode at a side of the drain electrode away from the base; and
    an arrangement direction of the at least four step portions is parallel to the extension direction of the channel between the source electrode and the drain electrode, wherein the arrangement direction of the at least four step portions is inclined to the base.

2. The pixel unit according to claim 1, wherein at least two step portions are provided at each of the first side and the second side of the drain electrode.

3. The pixel unit according to claim 1, wherein at least two step portions are provided at the first side or the second side of the drain electrode.

4. The pixel unit according to claim 1, wherein two step portions are provided at at least one of the first side and the second side of the drain electrode.

5. The pixel unit according to claim 4, wherein a thickness of the drain electrode is 4000 Å, and a height of a lower step portion of the two step portions provided at one side of the drain electrode ranges from 1500 Å to 3500 Å.

6. The pixel unit according to claim 4, wherein the two step portions provided at one side of the drain electrode have an identical height.

7. The pixel unit according to claim 2, wherein the at least two step portions provided at the first side of the drain electrode have an identical height and the at least two step portions provided at the second side of the drain electrode have an identical height.

8. The pixel unit according to claim 3, wherein the at least two step portions provided at the first side of the drain electrode have an identical height, or the at least two step portions provided at the second side of the drain electrode have an identical height.

9. The pixel unit according to claim 2, wherein the number of the step portions provided at the first side of the drain electrode is equal to the number of the step portions provided at the second side of the drain electrode.

10. The pixel unit according to claim 9, wherein heights of the step portions provided at the first side of the drain electrode are respectively identical to heights of the step portions provided at the second side of the drain electrode.

11. An array substrate comprising a pixel unit, wherein the pixel unit comprises a display region and a thin film transistor (TFT) component region, in the TFT component region, a base, a gate line, a gate insulating layer, an active layer and a data line, a source electrode and a drain electrode, and a pixel electrode lapped onto the drain electrode are provided sequentially from the bottom up, wherein
    an extension direction of a channel between the source electrode and the drain electrode is perpendicular to a direction oriented from the source electrode to the drain electrode;
    a top surface of the drain electrode has at least four step portions arranged along the extension direction of the channel, and portions of the top surface of the drain electrode at two sides of each of the at least four step portions have different heights relative to a top surface of the gate insulating layer;
    wherein the pixel electrode is in contact with each of the at least four step portions of the top surface of the drain electrode at a side of the drain electrode away from the base; and
    an arrangement direction of the at least four step portions is parallel to the extension direction of the channel between the source electrode and the drain electrode, wherein the arrangement direction of the at least four step portions is inclined to the base.

12. The array substrate according to claim 11, wherein the at least two step portions provided at one side of the drain electrode have an identical height.

13. A display panel, comprising the array substrate according to the claim 11.

14. The display panel according to claim 13, wherein the at least two step portions provided at one side of the drain electrode have an identical height.

15. A display device, comprising the display panel according to the claim 13.

16. A manufacturing method of an array substrate, wherein the array substrate comprises a plurality of pixel units, each of the plurality of pixel units comprises a display region and a thin film transistor (TFT) component region, wherein in the TFT component region, a base, a gate line, a gate insulating layer, an active layer and a data line, a source electrode and a drain electrode, and a pixel electrode lapped onto the drain electrode are provided sequentially from the bottom up, an extension direction of a channel between the source electrode and the drain electrode is perpendicular to a direction oriented from the source electrode to the drain electrode, a top surface of the drain electrode has at least four step portions arranged along the extension direction of the channel and portions of the top surface of the drain electrode at two sides of each of the at least four step portions have different heights relative to a top surface of the gate insulating layer, and the pixel electrode is in contact with each of the at least four step portions of the top surface of the drain electrode at a side of the drain electrode away from the base, and wherein the manufacturing method comprises:

providing the base, forming a patterned gate line on the base, forming the gate insulating layer on the gate line, and forming the active layer and the data line on the gate insulating layer;

forming a patterned source electrode and a patterned drain electrode on the active layer;

forming the at least four step portions adjacent to each other in the upward direction at the at least one of the first side of the drain electrode close to the display region and the second side of the drain electrode away from the display region by means of a partially transparent mask plate; and lapping the pixel electrode onto the drain electrode having the step portions gently;

wherein an arrangement direction of the at least four step portions is parallel to the extension direction of the channel between the source electrode and the drain electrode, wherein the arrangement direction of the at least four step portions is inclined to the base.

* * * * *